(12) United States Patent
Bai et al.

(10) Patent No.: US 9,214,447 B2
(45) Date of Patent: Dec. 15, 2015

(54) NON-LEADED TYPE SEMICONDUCTOR PACKAGE AND METHOD OF ASSEMBLING SAME

(71) Applicants: Zhigang Bai, Tianjin (CN); Zhijie Wang, Tianjin (CN); Jinzhong Yao, Tianjin (CN)

(72) Inventors: Zhigang Bai, Tianjin (CN); Zhijie Wang, Tianjin (CN); Jinzhong Yao, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/277,061

(22) Filed: May 14, 2014

(65) Prior Publication Data

US 2015/0028468 A1 Jan. 29, 2015

(30) Foreign Application Priority Data

Jul. 26, 2013 (CN) .......................... 2013 1 0317710

(51) Int. Cl.
| | |
|---|---|
| *H01L 23/00* | (2006.01) |
| *H01L 23/31* | (2006.01) |
| *H01L 23/495* | (2006.01) |
| *H01L 21/48* | (2006.01) |

(52) U.S. Cl.
CPC ............ *H01L 24/85* (2013.01); *H01L 23/3107* (2013.01); *H01L 21/4842* (2013.01); *H01L 23/49541* (2013.01); *H01L 24/32* (2013.01); *H01L 24/48* (2013.01); *H01L 24/83* (2013.01); *H01L 2224/32245* (2013.01); *H01L 2224/48245* (2013.01); *H01L 2224/85* (2013.01); *H01L 2224/92247* (2013.01); *H01L 2924/00014* (2013.01); *H01L 2924/181* (2013.01)

(58) Field of Classification Search
CPC ..... H01L 24/04; H01L 24/85; H01L 23/3107; H01L 23/49541; H01L 21/4832; H01L 21/4842

See application file for complete search history.

(56) References Cited

U.S. PATENT DOCUMENTS

| | | | |
|---|---|---|---|
| 6,713,849 B2 | 3/2004 | Hasebe | |
| 7,060,535 B1 * | 6/2006 | Sirinorakul et al. | .......... 438/123 |
| 2002/0177254 A1 * | 11/2002 | Chow et al. | ................... 438/107 |
| 2010/0072591 A1 | 3/2010 | Camacho | |

* cited by examiner

*Primary Examiner* — Victor A Mandala
*Assistant Examiner* — Quovaunda V Jefferson
(74) *Attorney, Agent, or Firm* — Charles Bergere

(57) ABSTRACT

A no-lead type semiconductor package has a mold cap that forms a mold body. The corners of the mold body are reinforced with mold columns such that the corners have rounded protrusions and do not form 90° angles. The mold columns prevent the corner pads from peeling.

12 Claims, 5 Drawing Sheets

NON-LEADED TYPE SEMICONDUCTOR PACKAGE AND METHOD OF ASSEMBLING SAME

BACKGROUND OF THE INVENTION

The present invention is directed to integrated circuit packaging and, more particularly, to a non-leaded type semiconductor package and method of assembling a non-leaded type package.

In response to continually increasing demands on information and communication products for reduced size and cost, and increased functionality and performance, semiconductor packages have evolved to accommodate increased component density with more I/Os and a smaller footprint. One such package is a non-leaded type semiconductor package, such as Quad Flat Non-leaded package (QFN). Non-leaded semiconductor packages are resin-sealed devices assembled using a lead frame, and are formed by molding on one side of the lead frame. The leads, rather than extending out from the mold body, lie flush with the mold body.

However, different challenges arise from integrating increased functionality and miniaturization. For example, during multiple insertion test, as well as shipment in tray or tape and reel, for a QFN package, the punch-corner pads of the package may peel off, which seriously affects the quality of the package and can cause a Customer Quality Incident (CQI).

Therefore, it would be desirable to improve the package to solve the above-described problem.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Figure 1:
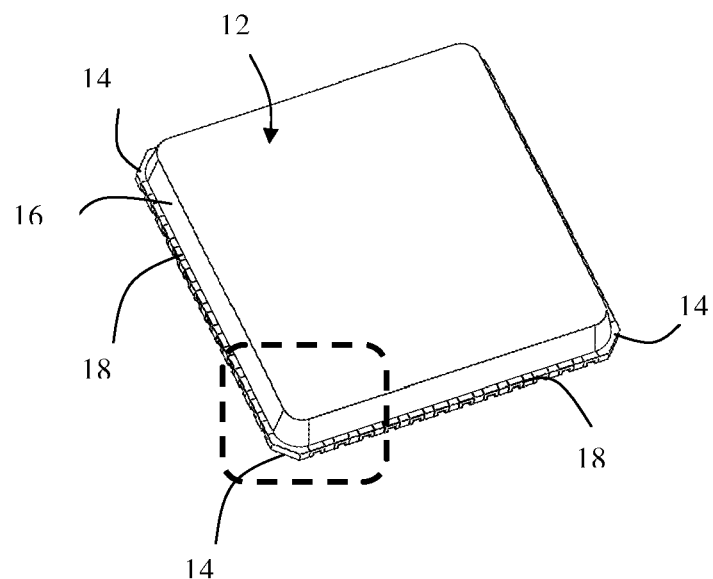
FIG. 1 is a perspective view of a conventional non-leaded semiconductor package.
Figure 2:
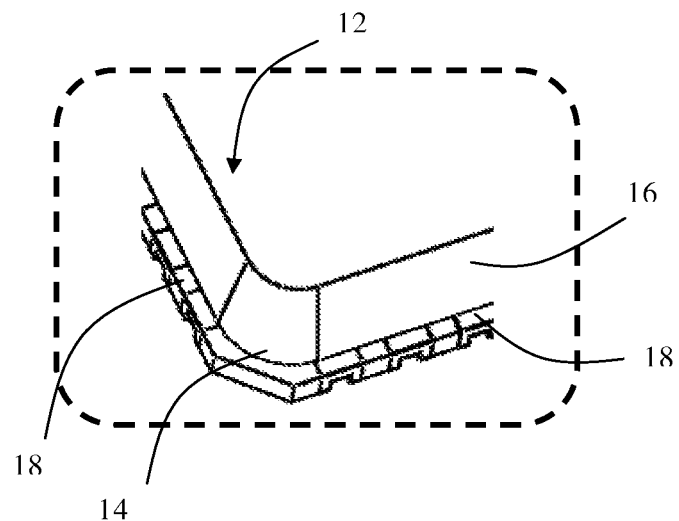
FIG. 2 is an enlarged sectional view of a part of the convention package shown in FIG. 1.

FIG. 1 is a perspective view of a conventional non-leaded type semiconductor package 10. The package 10 is a QFN package including a die (not shown) encapsulated with a molding compound, which forms a mold cap 12. FIG. 2 is an enlarged sectional view of a corner 14 of the semiconductor package 10. The mold cap 12 has a mold body 16 and a plurality of leads 18 that are exposed along the bottom and side surfaces of the mold body 16. The exposed portions of the leads 18 on the sides of the package 10 may have an indent or groove along the flank thereof, known as a wettable flank. The leads 18 provide a path for power and signal transfer between the die and external devices, such as a circuit board (not shown).

Generally, the conventional semiconductor package 10 is assembled with the following steps or processes: providing a lead frame including a die flag and leads that surround the die flag; die bonding for attaching a die to the die flag; wire bonding for electrically connecting the die to the leads with bond wires; encapsulation to cover the die, leads and bond wires with the mold cap 12; and trim and form for separating an assembled device from adjacent devices formed at the same time. In the trim and form step, the lead frame tie bar and the parts of the leads that extend beyond the mold body 16 are cut off, such as by punching. If by punching, the leads 18 and tie bar are punched in a single step.

The semiconductor package 10 may be mounted by matching and soldering the bottom surfaces of the leads 18 to a matching pattern on a circuit board. However, it has been found that the leads 18 at the corners 14 are prone to peeling away from the mold body 16 if subjected to multiple insertion tests. Furthermore, the leads 18 adjacent to the corners 14 can have a tendency to crack during electrical tests and tray handling. Specifically, when performing electrical tests on the package 10, the package 10 is positioned in a socket of a tester (not shown) using the friction force between the corners 14 and the socket. Thus, the leads 18 adjacent to the corners 14 receive mechanical peeling stress, which places the leads 18 at the corners 14 at high risk of peeling. Meanwhile, during handling while the package 10 is in a tray, the corners 14 of the package 10 can knock against the tray (not shown), which also can lead to the corner leads 18 being damaged.

The present invention provides a semiconductor package and assembly method that overcome the above-mentioned corner lead peeling issues. In one embodiment, the present invention provides a semiconductor package, including a die flag having an upper surface and a lower surface; a semiconductor die attached on the upper surface of the die flag; a plurality of leads surrounding the die flag, wherein each of the leads has a top surface and a bottom surface opposite to the top surface, and the top surface is electrically connected with the semiconductor die with a bond wire; and a mold cap that covers the semiconductor die, bond wires, and at least a portion of each of the leads. The mold cap comprises a generally rectangular mold body. The mold body has reinforced corners comprising mold columns that protrude from each of said corners.

In another embodiment, the present invention provides a method of assembling a semiconductor package, including the steps of providing a lead frame including a die flag and a plurality of leads surrounding the die flag, wherein each of the leads has a top surface and a bottom surface opposite to the top surface; bonding a semiconductor die on a top surface of the die flag; electrically connecting bonding pads on a top surface of the semiconductor die with the top surfaces of the leads with bond wires; forming a mold cap by encapsulating the die flag, the semiconductor die, the bond wires and at least a portion of each of the leads with a mold compound, wherein the mold cap comprises a generally rectangular mold body with reinforced corners comprising mold columns that protrude from each of said corners; and performing a trim and form operation that removes portions of the lead frame that extend beyond said mold cap.

In one embodiment, the trip and form operation includes a first punching process to remove the portions of the leads that extend beyond the mold body and rails of the lead frame from which the leads extend, and a second punching process to remove tie bar pads located at outer corners of the lead frame, where the rails meet.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiments disclosed may be readily used as a basis for modifying or designing other structures or processes for carrying out the same purposes of the present invention. It should also be realized by those skilled in the art that such equivalent constructions do not depart from the spirit and scope of the invention as set forth in the appended claims.

Figure 3:
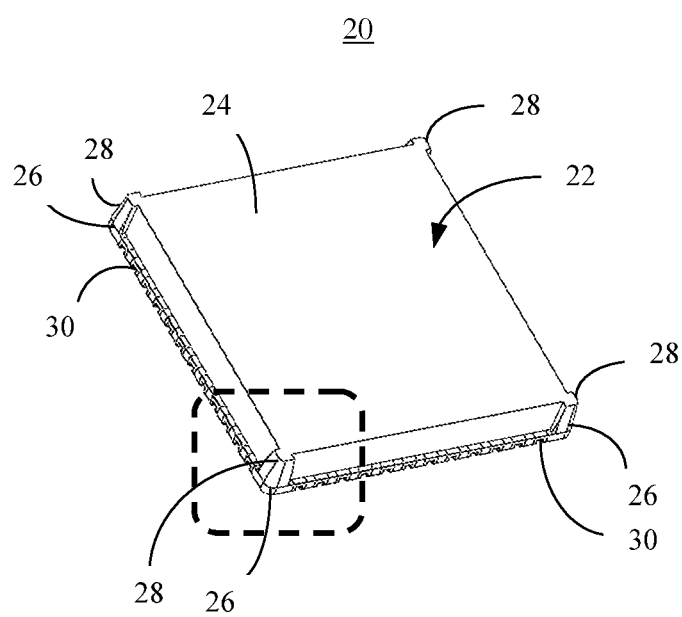
FIG. 3 is a perspective view of a non-leaded semiconductor package according to an embodiment of the present invention.

Referring now to FIG. 3, a perspective view of a non-leaded type semiconductor package 20 according to an embodiment of the present invention is shown. The package 20 is a QFN type package having a mold cap 22 that comprises a mold body 24. The mold body 24 is generally rectangular in shape having four corners 26 and mold columns 28 respectively formed at each of the four corners 26. The mold columns 28 are formed at the corners 26 of the mold body 24 such that, in the embodiment shown, the corners 26 of the mold body 24 are rounded. Whereas in a conventional package the corners form a 90° angle, in the present invention, since the mold columns 28 protrude from the mold body 24, the corners 26 do not form a 90° angle. The mold cap 22 may be formed of an epoxy resin or plastic material, as is known in the art, with a molding process.

Figure 4:
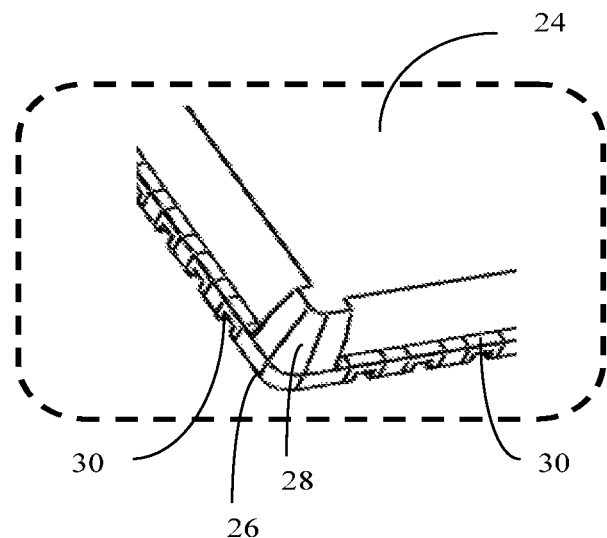
FIG. 4 is an enlarged sectional view of a part of the semiconductor package shown in FIG. 3.

FIG. 4 is an enlarged perspective view of one of the corners 26 of the package 20. In FIG. 4, it can be seen that the mold columns 28 have a height that is equal to a height of the mold body 24. However, in other embodiments, the height of the mold columns 28 could be less than the height of the mold body 24. The mold columns 28 reinforce the corners 26, as will be discussed in more detail below.

Referring again to FIG. 3, the package 20 also has a plurality of leads 30 that are exposed around the bottom edges of the mold body 24. The leads 30 also may be exposed on the bottom surface of the package 20 around the peripheral outer edges of the package 20. The leads 30 exposed around the sides of the package 10 may include an indent or channel such that they are wettable flanks. A wettable flank means that the exposed edges of the leads 30 include a channel or indent that is plated (instead of bare Cu), which allows solder to flow into the channel and adhere to the side of the lead. The wettable flank allows for visual inspection of solder joints.

Figure 5A:
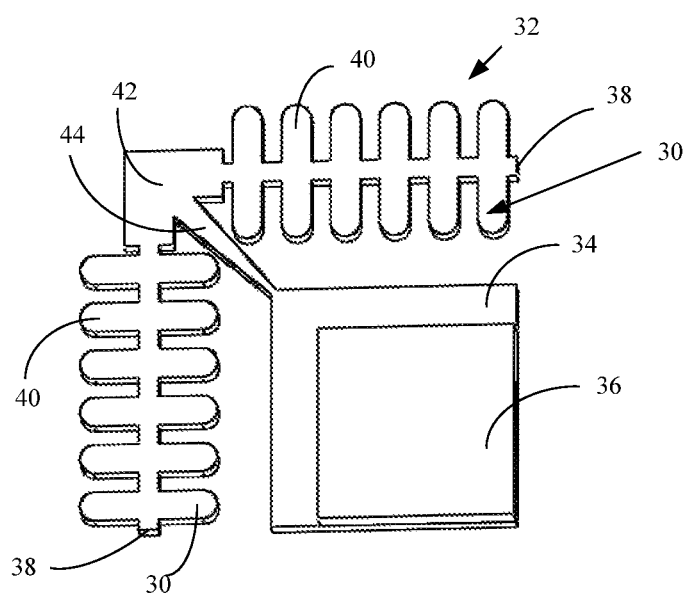
FIG. 5A is a perspective view of a part of the package of FIG. 3 in a partially assembled state in accordance with an embodiment of the present invention.

FIG. 5A is a perspective view of the package 20 in a partially assembled state, particularly showing a part of a lead frame 32 of the package 20. The lead frame 32 includes a die flag 34 for supporting a semiconductor die 36. As is known in the art, the die 36 is attached to a surface of the die flag 34 with a die attach adhesive (not shown). The die flag 34 is sized and shaped to receive the die 36, so in the embodiment shown, the die flag 34 is generally rectangular, as is the die 36, and slightly larger than the die 36. However, other sized and shaped die flags may be used with the present invention, such as an X-shaped flag or a smaller sized flag.

The lead frame 32 has a plurality of rails 38 that are spaced from and surround the die flag 34. Thus, since the flag 34 is rectangular, there are four rails 38 that surround the flag 34 (portions of two of the rails are shown in FIG. 5A). The leads 30 extend from the rails 38 towards the die flag 34. There also are other leads 40 opposite from the leads 30 that extend from the rails 38 away from die flag 34. The other leads 40 actually extend towards another die flag (not shown), as is known in the art, since the lead frame 32 is one of a plurality of lead frames formed in an array that allows for simultaneous assembly of multiple packages. The rails 38 meet at corner tie bar pads 42. According to the present invention, it is preferred that the corner tie bar pads 42 have a width that is greater than a width of the rails 38 because the tie bar pads 42 are used to support the mold columns 28. Tie bars 44 interconnect the die flag 34 and the tie bar pads 42 by extending from the corners of the flag 34 to the tie bar pads 42. The lead frame 32 may be formed of a conductive material, such as copper and usually are formed from a bare metal (Cu) sheet that may or may not be plated with another metal, such as Palladium.

Figure 5B:
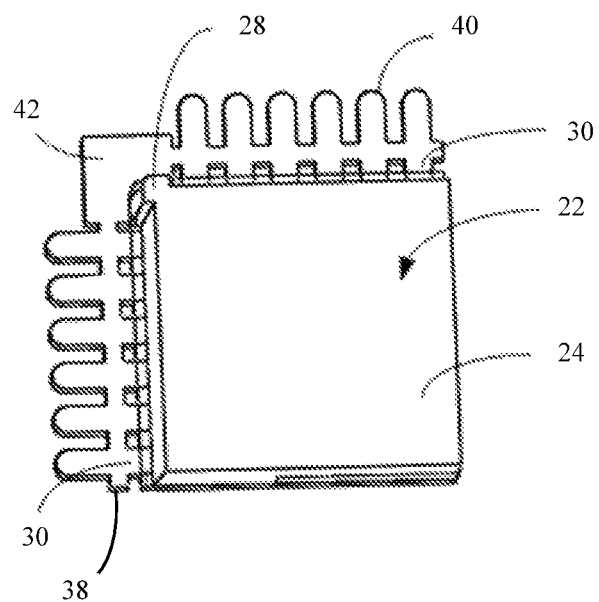
FIG. 5B is a perspective view of a part of the package of FIG. 3 during assembly after undergoing a molding process.

FIG. 5B is a perspective view of a part of the non-leaded semiconductor package 20 of FIG. 5A after undergoing a molding process in which the die 36, bond wires connecting the die 36 to the leads 30 (now shown), and portions of the leads 30 are covered with a molding compound. That is, the molding process forms the mold cap 22. The molding process, instead of using a standard generally rectangular mold cavity, uses a modified mold cavity that allows for the formation of the mold columns 28. As can be seen, the mold cap 22 partially covers the leads 30 (part way to the rails 38) and also, at the corners, the mold columns 28 are formed over a portion of the corner tie bar pads 42. Thus, the ends of the tie bars 44 and a portion of the tie bar pads 42 support the mold columns 28.

Figure 5C:
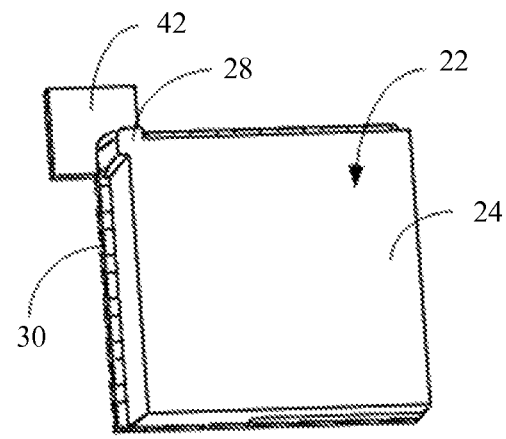
FIG. 5C is a perspective view of a part of the package of FIG. 3 during assembly after undergoing a punching operation.

FIG. 5C is a perspective view of the partially assembled package 20 of FIG. 5B after undergoing a first step of a trim and form process. More particularly, after the molding or encapsulation process, a first punch operation is performed to remove the rails 38 and parts of the leads 30 that extend beyond the mold body 24. FIG. 5B shows the rails 38 and leads 30 before being removed and FIG. 5C shows the package 20 with the rails 38 and parts of the leads 30 removed. Although a punching process is preferred, other separation processes could be used, such as cutting with a saw or a laser. After the first punching process, a second punching process is performed to remove the portions of the corner tie bar pads 42 that extend beyond the mold body 24.

Figure 6:
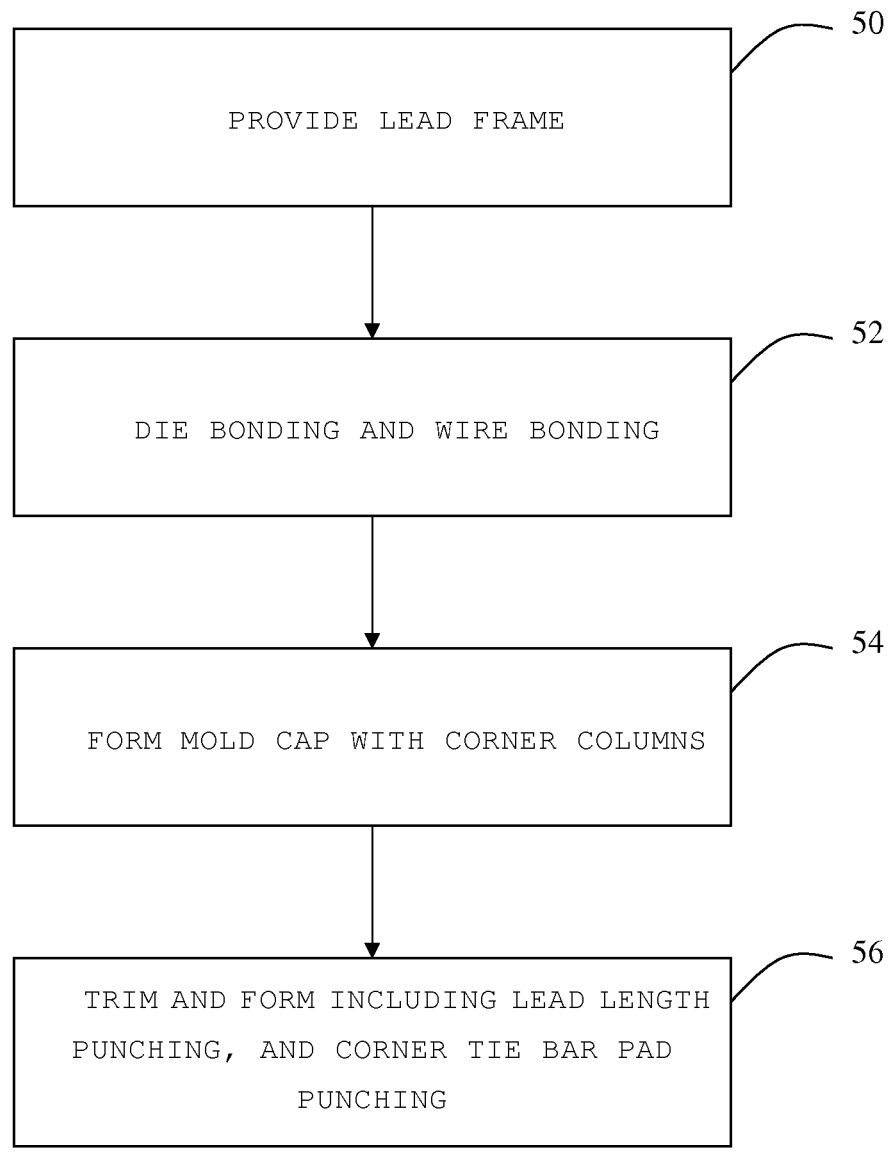
FIG. 6 is a flow chart illustrating a method of manufacturing the package shown in FIG. 3 according to an embodiment of the present invention, given by way of example.

FIG. 6 is a flow chart illustrating the step of assembling the package 20. In a first step 50, a lead frame including a die flag and a plurality of leads surrounding the die flag is provided. The lead frame may comprise one of a plurality of lead frames formed in a matrix that allows for simultaneously assembling a plurality of packages. Each of the leads has a top surface and a bottom surface opposite to the top surface. The lead frame may comprise bare copper or a plated or partially plated copper frame, as is known in the art.

In a second step 52, a semiconductor die is attached or bonded on a top surface of the die flag using an adhesive and then bonding pads on a top surface of the semiconductor die are electrically connected with the top surfaces of the leads with bond wires using a known wire bonding process.

In a third step 54, an encapsulation or molding process is performed to form the mold cap 22 that covers the die, bond wires, and portions of the lead frame. The molding process includes forming the corner mold columns 28 shown in FIG. 3. In one embodiment, the mold cap comprises a generally rectangular mold body with the reinforced corners comprising mold columns that protrude from each of said corners.

Finally, in step 56, a trim and form operation is performed to remove portions of the lead frame that extend beyond the mold cap. In a preferred embodiment, the trim and form process includes a first punching operation in which the lead frame rails and portions of the leads 30 are removed, followed by a second punching operation in portions of the tie bar pads 42 are removed.

The above embodiments are provided concerning a single semiconductor package 20. Actually, a plurality of semiconductor packages 20 according to the invention can be manufactured at one time in a matrix configuration including multiple leadframes, which are later separated or "singulated", after the molding process. Consequently, packaged electronic devices according to the invention can be produced quickly and at low cost. Persons skilled in the art should know how to apply the present invention illustrating the manufacturing method of a single semiconductor package to that manufacturing a plurality of semiconductor package simultaneously.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the present invention, as described in the claims.

The invention claimed is:

1. A semiconductor package, comprising:
a die flag having an upper surface and a lower surface;
a semiconductor die attached on the upper surface of the die flag;
a plurality of leads surrounding the die flag, wherein each of the leads has a top surface and a bottom surface opposite to the top surface, and the top surface is electrically connected with the semiconductor die with a bond wire; and
a mold cap that covers the semiconductor die, bond wires, and at least a portion of each of the leads, wherein the mold cap comprises a generally rectangular mold body, and wherein the mold body has reinforced corners comprising mold columns that protrude from each of said corners,
wherein the mold columns are formed at the corners of the mold body such that the corners of the mold body are rounded.

2. The semiconductor package of claim 1, wherein the mold cap is formed of an epoxy resin material.

3. The semiconductor package of claim 1, wherein each of the plurality of mold columns has a height equal to or less than a height of the mold body.

4. The semiconductor package of claim 1, wherein the bottom surface of each of the leads is exposed.

5. The semiconductor package of claim 4, wherein the lower surface of the die flag is exposed.

6. The semiconductor package of claim 4, wherein distal ends of the leads are exposed along the side edges of the mold body.

7. The semiconductor package of claim 1, wherein the mold columns prevent the corners from forming a 90° angle.

8. A method of assembling a semiconductor package, comprising:
providing a lead frame including a die flag and a plurality of leads surrounding the die flag, wherein each of the leads has a top surface and a bottom surface opposite to the top surface;
bonding a semiconductor die on a top surface of the die flag;
electrically connecting bonding pads on a top surface of the semiconductor die with the top surfaces of the leads with bond wires;
forming a mold cap by encapsulating the die flag, the semiconductor die, the bond wires and at least a portion of each of the leads with a mold compound, wherein the mold cap comprises a generally rectangular mold body with reinforced corners comprising mold columns that protrude from each of said corners; and
performing a trim and form operation that removes portions of the lead frame that extend beyond said mold cap,
wherein the lead frame further includes a plurality of rails that surround the die flag and from which the leads extend toward the die flag, wherein each of the rails is parallel to a respective one of (i) a side of the die flag, (ii) a plurality of tie bars that extend from corners of the die flag to the rails, and (iii) a plurality of tie bar pads that join respective ones of the tie bars with the rails at corners of the lead frame, and wherein the trim and form operation comprises removing the rails and tie bar pads.

9. The method of assembling a semiconductor package of claim 8, wherein the rails and tie bar pads are removed by punching.

10. The method of assembling a semiconductor package of claim 9, wherein a first punch operation is performed to remove the rails and a second punch operation is performed to remove the tie bar pads.

11. The method of assembling a semiconductor package of claim 9, wherein the semiconductor package is a punch QFN package.

12. The method of assembling a semiconductor package of claim 8, wherein each of the plurality of mold columns has a height equal to or less than a height of the mold body.

* * * * *